United States Patent
Raberg et al.

(10) Patent No.: US 7,715,225 B2
(45) Date of Patent: May 11, 2010

(54) MEMORY CELL USING SPIN INDUCED SWITCHING EFFECTS

(75) Inventors: Wolfgang Raberg, Sauerlach (DE); Ulrich Klostermann, Munich (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 118 days.

(21) Appl. No.: 12/036,518

(22) Filed: Feb. 25, 2008

(65) Prior Publication Data
US 2009/0213642 A1 Aug. 27, 2009

(51) Int. Cl.
*G11C 11/00* (2006.01)
(52) U.S. Cl. ..................... 365/158; 365/173
(58) Field of Classification Search ........... 365/158, 365/173
See application file for complete search history.

(56) References Cited

U.S. PATENT DOCUMENTS

| | | | | |
|---|---|---|---|---|
| 2005/0237787 A1* | 10/2005 | Huai et al. | .................. | 365/158 |
| 2006/0126371 A1* | 6/2006 | Nagase et al. | ............... | 365/145 |
| 2007/0007610 A1* | 1/2007 | Saito et al. | .................. | 257/422 |

OTHER PUBLICATIONS

Lee, Y.M., et al., "Low Switching Field of Sub-Micron Sized MTJs With Synthetic Ferrimagnet Free Layer Based On NiFe/Ru/NiFe Multilayers," Digests of the IEEE International, Presentation at MMM-Conference 2005, 1 Page.
Stiles, M.D., et al. "Anatomy of a Spin-Transfer Torque," Phys. Rev. B 66,014407 (2002) 14 Pages.
Slonczewski, J.C., "Current Driven Excitation of Magnetic Multilayers," Journal of Magnetism and Magnetic Materials, 1996, pp. L1-L7, vol. 159, Elsevier Science. B.V.
Berger, L., "Emission of Spin Waves by a Magnetic Multilayer Traversed by a Current," Physical Review B., Oct. 1, 1996, pp. 9353-9358, vol. 54, No. 13.

* cited by examiner

*Primary Examiner*—Hoai V Ho
(74) *Attorney, Agent, or Firm*—Slater & Matsil, L.L.P.

(57) ABSTRACT

According to an embodiment, an integrated circuit includes a magneto-resistive memory cell. The magneto-resistive memory cell includes: a first ferromagnetic layer; a second ferromagnetic layer; and a nonmagnetic layer being disposed between the first ferromagnetic layer and the second ferromagnetic layer. The integrated circuit further includes a programming circuit configured to route a programming current through the magneto-resistive memory cell, wherein the programming current programs the magnetizations of the first ferromagnetic layer and of the second ferromagnetic layer by spin induced switching effects.

21 Claims, 6 Drawing Sheets

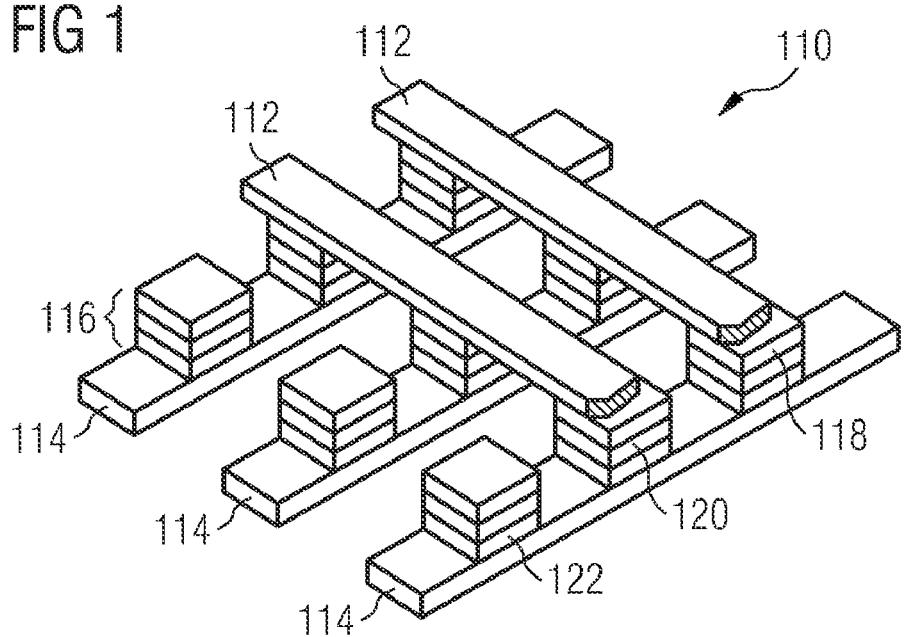
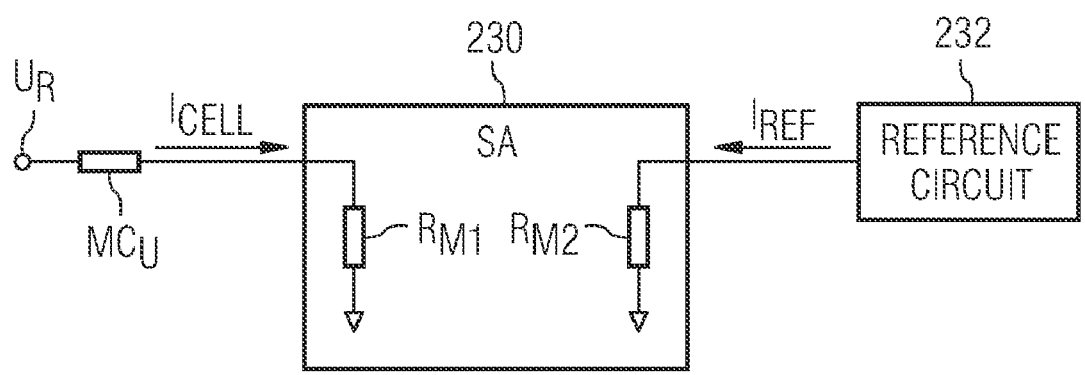

MEMORY CELL USING SPIN INDUCED SWITCHING EFFECTS

BACKGROUND

Integrated circuits using magneto-resistive memory cells are known. Due to the complex architecture of conventional magneto-resistive memory cells, it is rather complicated to scale the integrated circuits down to small feature sizes.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic prospective view of an integrated circuit including a plurality of magneto-resistive memory cells according to one embodiment;

FIG. 2 shows a schematic drawing of a circuit usable in conjunction with the integrated circuit shown in FIG. 1;

DETAILED DESCRIPTION OF ILLUSTRATIVE EMBODIMENTS

Figure 3:
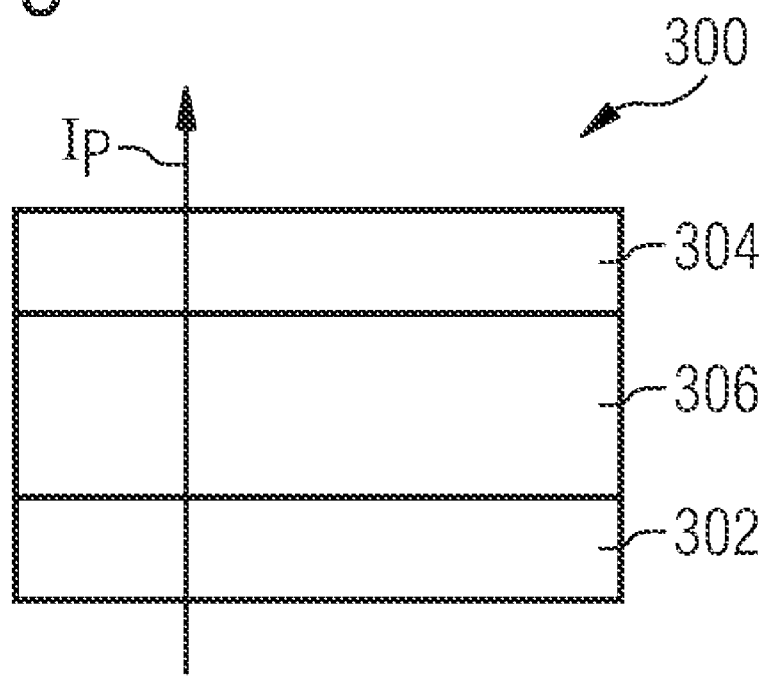
FIG. 3 shows a schematic cross-sectional view of a magneto-resistive memory cell according to one embodiment.

FIG. 1 illustrates a perspective view of a MRAM device 110 having bit lines 112 located orthogonal to word lines 114 in adjacent metallization layers. Magnetic stacks 116 are positioned between the bit lines 112 and word lines 114 adjacent and electrically coupled to bit lines 112 and word lines 114. Magnetic stacks 116 include a first magnetization layer 118, a nonmagnetic layer (e.g. tunnel layer) 120, and a second magnetization layer 122, for example. The magnetic stacks 116 may include further layers. Generally, the architecture of the magnetic stacks 116 may correspond to the architectures of the embodiments of the memory cells discussed in the following description. The logic state of a magnetic stack 116 is represented by the magnetizations of the first magnetization layer 118 and of the second magnetization layer 122 of a magnetic stack 116 and is generated by routing a programming current through the magnetic stack 116.

In order to read the logic state stored in the magnetic stack 116, a schematic such as the one shown in FIG. 2, including a sense amplifier (SA) 230, is used to determine the logic state stored in an unknown memory cell MCu. A reference voltage $U_R$ is applied to one end of the unknown memory cell MCu. The other end of the unknown memory cell MCu is coupled to a measurement resistor $R_{m1}$. The other end of the measurement resistor $R_{m1}$ is coupled to ground. The current running through the unknown memory cell MCu is equal to current $I_{cell}$. A reference circuit 232 supplies a reference current $I_{ref}$ that is run into measurement resistor $R_{m2}$. The other end of the measurement resistor $R_{m2}$ is coupled to ground, as shown.

FIG. 3 shows a part of a magneto-resistive memory cell 300 which may be a part of an integrated circuit according to an embodiment. The magneto-resistive memory cell 300 includes a first ferromagnetic layer 302, a second ferromagnetic layer 304, and a nonmagnetic layer 306 being disposed between the first ferromagnetic layer 302 and the second ferromagnetic layer 304.

According to an embodiment, the magneto-resistive memory cell 300 is arranged such that the magnetizations of the first ferromagnetic layer 302 and the second ferromagnetic layer 304 are programmable by spin induced switching effects. The switching effects are caused by a programming current $I_P$ which is routed through the magneto-resistive memory cell 300. The programming current $I_P$ is generated by a programming circuit (not shown).

According to an embodiment, the programming current $I_P$ is a unidirectional current, i.e., all programming processes setting an arbitrary information use programming currents having the same flowing direction through the magneto-resistive memory cell 300. Here, it is assumed that the programming current flowing direction points from the first ferromagnetic layer 302 to the second ferromagnetic layer 304. However, it is also possible to route the programming current $I_P$ through the magneto-resistive memory cell 300 using the opposite routing direction.

According to an embodiment, the current strength of a programming current $I_P$ which is used to program the magnetization of the first ferromagnetic layer 302 is different from the current strength of a programming current $I_P$ used to program the magnetization of the second ferromagnetic layer 304.

According to an embodiment, the current strengths used for programming the first ferromagnetic layer 302 and the second ferromagnetic layer 304 are larger than the current strengths used for detecting the memory state (electrical resistance) of the magneto-resistive memory cell 300.

According to an embodiment, current strengths used for programming the magnetizations of the first ferromagnetic layer 302 and the second ferromagnetic layer 304 range from about 10 µA to about 1 mA.

According to an embodiment, time durations used for programming the magnetizations of the first ferromagnetic layer 302 and the second ferromagnetic layer 304 range from about 50 ps to about 100 ns.

According to an embodiment, both the current strength and the time duration of a programming current $I_P$ which are used to program the magnetization of the first ferromagnetic layer 302 are different from the current strength and the time duration of a programming current $I_P$ used to program the magnetization of the second ferromagnetic layer 304.

According to an embodiment, the first ferromagnetic layer 302 and the second ferromagnetic layer 304 can respectively adopt at least one magnetization direction which is substantially in-plane to the top surface of the first ferromagnetic layer 302/second ferromagnetic layer 304.

According to an embodiment, the first ferromagnetic layer 302 and the second ferromagnetic layer 304 include or consist of CoFeB, CoFe, NiFe, or a combination of these materials.

According to an embodiment, the first ferromagnetic layer 302 and the second ferromagnetic layer 304 can respectively adopt at least one magnetization direction which is substantially perpendicular to the top surface of the first ferromagnetic layer 302/second ferromagnetic layer 304.

According to an embodiment, the first ferromagnetic layer 302 and the second ferromagnetic layer 304 include or consist of 4f-alloys, L10 symmetry alloys or ultra thin multilayers of ferromagnetic materials, such as CoFeTb, CoPt, FePt, Ni/Co multilayers, and Co/Pt multilayers.

According to an embodiment, the nonmagnetic layer 306 includes or consists of AlOx, MgO, Cu, or a combination of these materials.

According to an embodiment, the thicknesses of the first ferromagnetic layer 302 and the second ferromagnetic layer 304 range from about 1 nm to about 20 nm.

According to an embodiment, the thickness of the nonmagnetic layer 306 ranges from about 0.3 nm to about 3 nm.

According to an embodiment, the magneto-resistive memory cell 300 is designed such that each memory state is represented by an area within an $I_P$-t plane, wherein $I_P$ is the programming current routed through the magneto-resistive memory cell 300, and wherein t is the time period for which the programming current $I_P$ is routed through the magneto-resistive memory cell 300.

According to an embodiment, in order to set a memory cell 300 to a memory state represented by a particular area, a programming current $I_P$ is routed through the memory cell 300 for a period of time t, wherein the pair of values ($I_P$; t) corresponds to a point which lies within the particular area.

According to an embodiment, each memory state is represented by an area confined by two border lines, the first border line being defined by equation $t*I_P=c1$, and the second border line being defined by equation $t*I_P=c2$, c1 and c2 being different constants.

Figure 4:
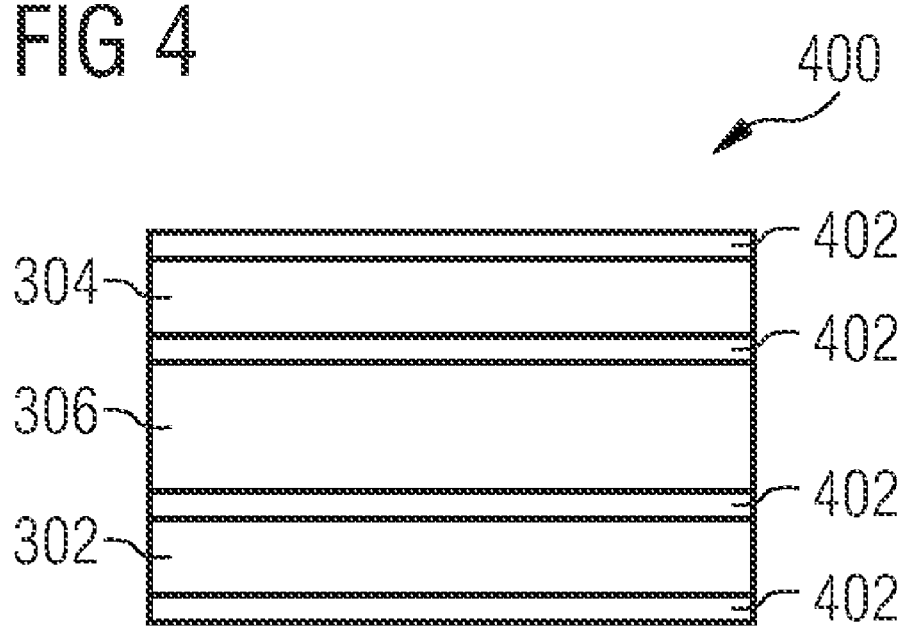
FIG. 4 shows a schematic cross-sectional view of a magneto-resistive memory cell according to one embodiment.

FIG. 4 shows a part of a magneto-resistive memory cell 400 which may be part of an integrated circuit according to an embodiment. The magneto-resistive memory cell 400 has the same architecture as that of the magneto-resistive memory cell 300. However, the magneto-resistive memory cell 400 further includes additional layers 402 which are disposed between the non-magnetic layer 306 and the first ferromagnetic layer 302, between the nonmagnetic layer 306 and the second ferromagnetic layer 304, above the second ferromagnetic layer 304, or below the first ferromagnetic layer 302. Some of the additional layers 402 may also be omitted.

According to an embodiment, the additional layers 402 serve as seed layers or cap layers and may, for example, include or consist of Ta, TaN, Ti, TiN, NiFeCr, or a combination of these materials.

One effect of embodiments of the present invention is that the magneto-resistive memory cells can be programmed without thermal heating (i.e., without using so called thermal select MRAM schemes) and without applying external magnetic fields (i.e., without using so called field select based MRAM schemes such as Toggle MRAM and Stoner-Wohlfarth switching schemes). As a consequence, the architecture of an integrated circuit including a plurality of such magneto-resistive memory cells can be simplified. For example, the programming circuitry may be simplified (e.g., no heating current providing means is necessary); further, the architecture of the magneto-resistive memory cell itself can be simplified (e.g., no magnetic field providing means is necessary). A further simplification may result from the fact that no bidirectional currents have to be used in order to program the magneto-resistive memory cell. That is, all memory states can be programmed using programming currents having the same flowing direction. In addition, a sensing current used to sense the resistance (i.e., the memory state) of the magneto-resistive memory cell may also have the same flowing direction.

If only unidirectional currents are used in order to program/read the memory states of the magneto-resistive memory cells, the select devices (e.g., diodes, bi-polar junction transistors (BJT) or field effect transistors (FET)), which serve for selecting a magneto-resistive memory cell among a plurality of magneto-resistive memory cells may consist of optimized diodes or BJTs. In this way, a further cell size reduction and simplification of the architecture of embodiments of integrated circuits according to the present invention can be achieved (no transistors are required as select devices). Also, diodes and BTJs enable higher programming current drivability compared to typical bidirectional FET select devices, which is very useful for cost effective and scalable memory cell concepts.

According to an embodiment, a memory cell arrangement is provided including a plurality of magneto-resistive memory cells. Each magneto-resistive memory cell includes: a first ferromagnetic layer; a second ferromagnetic layer; and a nonmagnetic layer being disposed between the first ferromagnetic layer and the second ferromagnetic layer. The memory cell arrangement may, for example, have the architecture shown in FIG. 1 (or may have a different architecture in which a select device is assigned to each magneto-resistive memory cell), wherein the magneto-resistive memory cell shown in FIG. 1 may have the architectures shown in FIGS. 3 and 4.

According to an embodiment, a memory module is provided including at least one integrated circuit including a plurality of magneto-resistive memory cells, each magneto-resistive memory cell including: a first ferromagnetic layer; a second ferromagnetic layer; and a non-magnetic layer being disposed between the first ferromagnetic layer and the second ferromagnetic layer.

According to an embodiment, the memory module is stackable.

Figure 5:
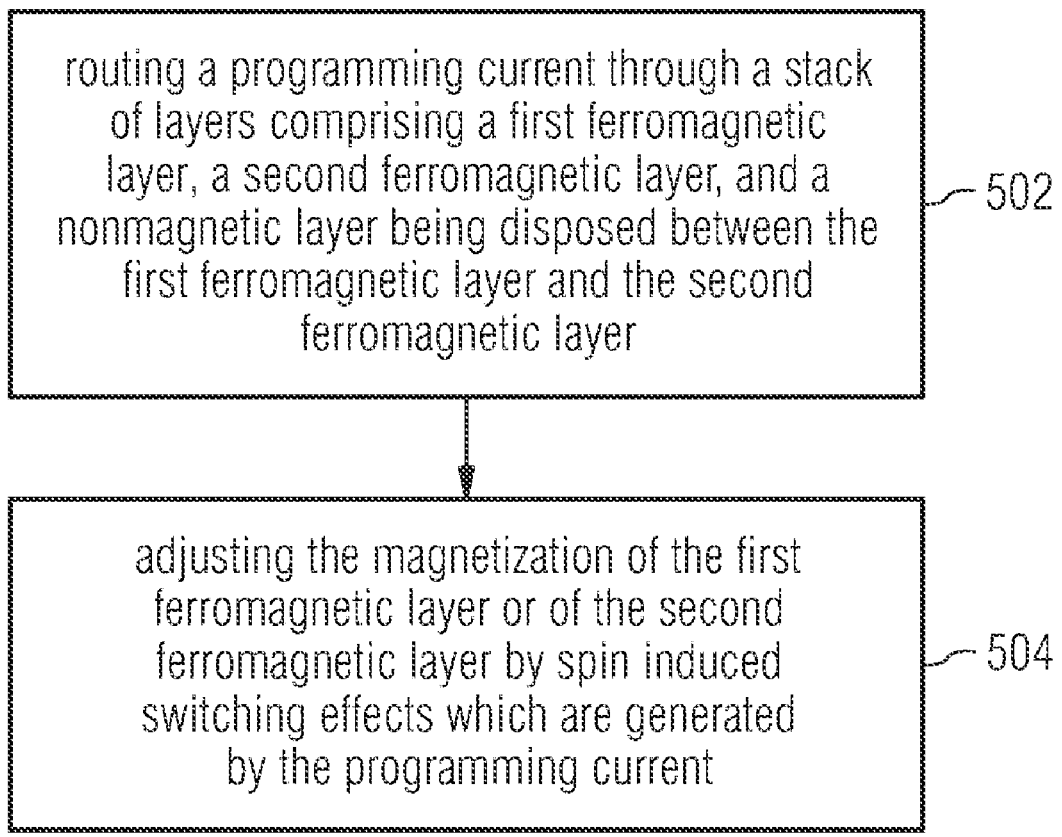
FIG. 5 shows a flow chart of a method of operating an integrated circuit according to one embodiment.

FIG. 5 shows a flow chart 500 of a method of operating an integrated circuit according to an embodiment. At 502, a programming current is routed through a stack of layers including a first ferromagnetic layer, a second ferromagnetic layer, and a nonmagnetic layer being disposed between the first ferromagnetic layer and the second ferromagnetic layer. At 504, the magnetizations of the first ferromagnetic layer or of the second ferromagnetic layer are adjusted by spin induced switching effects which are caused by the programming current.

According to an embodiment, a method of manufacturing a magneto-resistive memory cell is provided. The method includes: forming a first ferromagnetic layer; forming a second ferromagnetic layer; and forming a nonmagnetic layer being disposed between the first ferromagnetic layer and the second ferromagnetic layer.

In the following description, making reference to FIGS. 6 to 8, a method of operating a magneto-resistive memory cell according to an embodiment will be explained.

Figure 6:
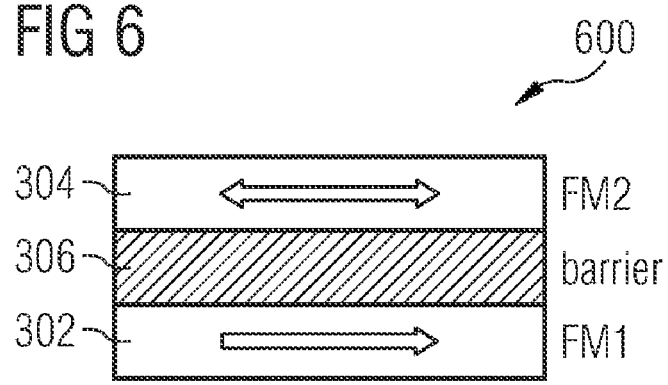
FIG. 6 shows a schematic cross-sectional view of an operating stage of a memory cell operating method according to one embodiment.

FIG. 6 shows a magneto-resistive memory cell 600 which may have the architecture of the magneto-resistive memory cell 300 shown in FIG. 3. However, it is to be understood that the operating method disclosed in the following is also applicable to other types of magneto-resistive memory cells, for example, to the magneto-resistive memory cell 400 shown in FIG. 4.

FIG. 6 shows a system having an in-plane magnetization. However, it is to be understood that the operating method disclosed in the following is also applicable to other types of spin torque switching cells, such as perpendicular magnetization cells.

In FIG. 6, the magnetization of the first ferromagnetic layer 302 is pointing to the right. In contrast thereto, the magnetization of the second ferromagnetic layer 304 may either point to the left or the right due to an imprinted anisotropy (defined, e.g., by shape or materials of the magneto-resistive memory cell 600) thus defining an initial memory state (which means that the first ferromagnetic layer 302 and the second ferromagnetic layer 304 either show parallel magnetizations (see FIG. 7) or anti-parallel magnetizations (see FIG. 8) with respect to each other).

In order to set the magneto-resistive memory cell 600 to a desired memory state being characterized by parallel magnetizations, a parallelizing programming current pulse $I_{PP}$ having a time duration $I_{PP}$ is driven through the magneto-resistive memory cell 600. The programming current pulse $I_{PP}$ is generated and supplied to the magneto-resistive memory cell 600 by a programming circuit (not shown). The programming current pulse $I_{PP}$ flows from the first ferromagnetic layer 302 to the second ferromagnetic layer 304. The programming current pulse $I_{PP}$ transports electrons into the second ferromagnetic layer 304, wherein the spin of the electrons cause the magnetization of the second ferromagnetic layer 304 pointing to the right. The strength and duration of the current pulse $I_{PP}$ is chosen such that enough spin is "transported" into the second ferromagnetic layer 304 in order to exert sufficient torque to align the magnetization of the second ferromagnetic layer 304 to the right.

Figure 8:
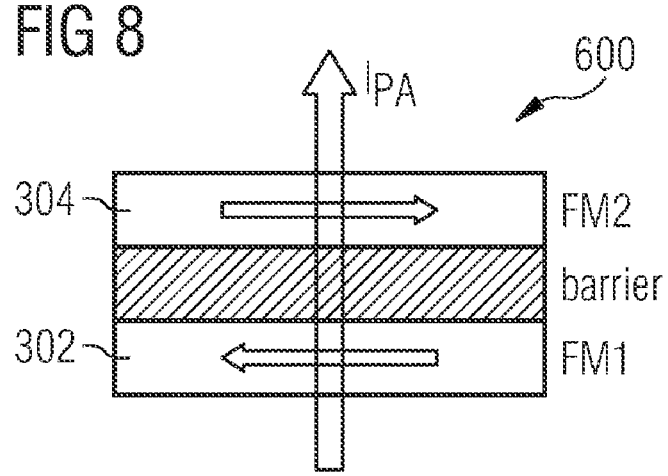
FIG. 8 shows a schematic cross-sectional view of an operating stage of a memory cell operating method according to one embodiment.

In contrast, to change the relative magnetization from parallel to antiparallel, as shown in FIG. 8, an antiparallelizing programming current pulse $I_{PA}$ with duration $I_{PA}$ is applied to the magneto-resistive memory cell 600 which again flows from the first ferromagnetic layer 302 to the second ferromagnetic layer 304. The strength of the programming current pulse $I_{PA}$ is chosen to be larger than the programming current pulse $I_{PP}$. The programming current pulse $I_{PA}$ transports further electrons into the second ferromagnetic layer 304, the spin of which strengthening the magnetization of the second ferromagnetic layer 304

Figure 7:
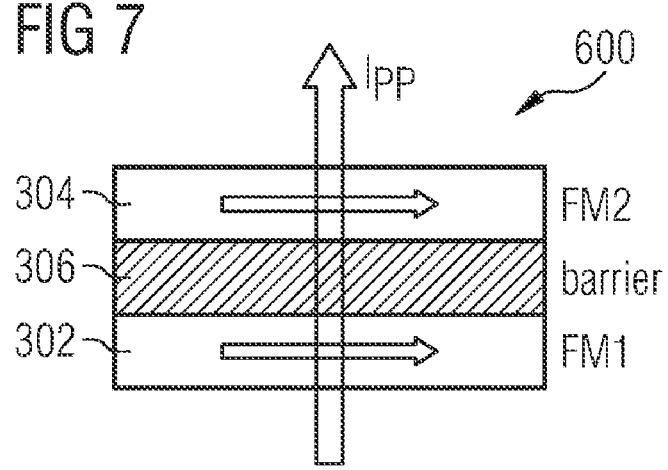
FIG. 7 shows a schematic cross-sectional view of an operating stage of a memory cell operating method according to one embodiment.

One effect of the operating method described in conjunction with FIG. 6 to 8 is that the magnetization directions of the first ferromagnetic layer 302 and the second ferromagnetic layer 304 do not have to be known in order to program the memory state of the memory cell 600 to a defined memory state. Instead, it is sufficient to know the relative magnetization between the first ferromagnetic layer 302 and the second ferromagnetic layer 304. That is, it is sufficient to know that either a parallel magnetization state (FIG. 7) or an anti-parallel magnetization state (FIG. 8) has been achieved: Only the relative magnetization orientation between the first ferromagnetic layer 302 and the second ferromagnetic layer 304 defines the resistance of the magneto-resistive memory cell 600. The concrete magnetization orientations do not affect the resistance and are therefore of no importance. Thus, a reference system having a fixed magnetization is not needed. The application of a current $I_{PP}$ (together with a corresponding application time) always yields a parallel magnetization, and the application of a current $I_{PA}$ (together with a corresponding application time) always yields a parallel magnetization irrespective of the magnetizations before the current application.

Figure 9A:
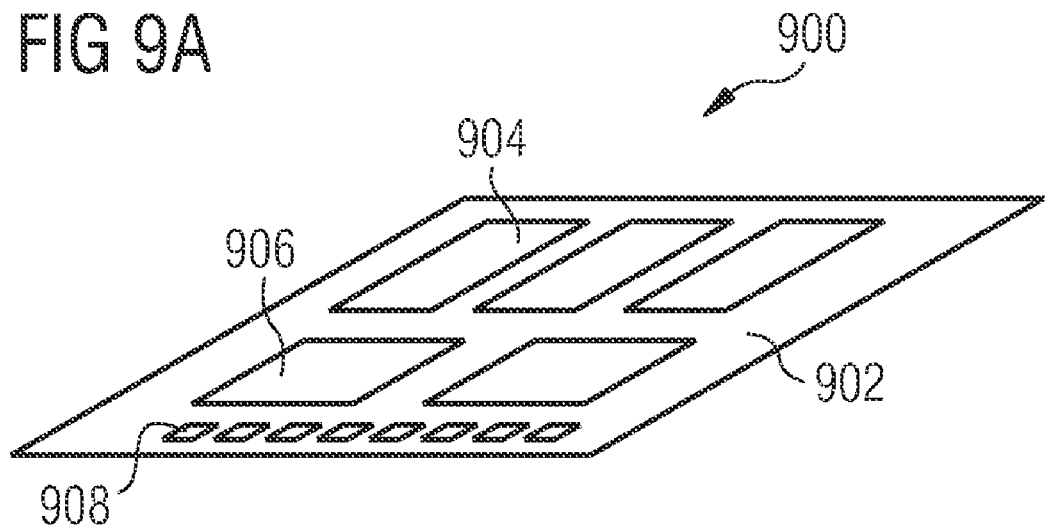
FIG. 9A shows a schematic perspective view of a memory module according to one embodiment.
Figure 9B:
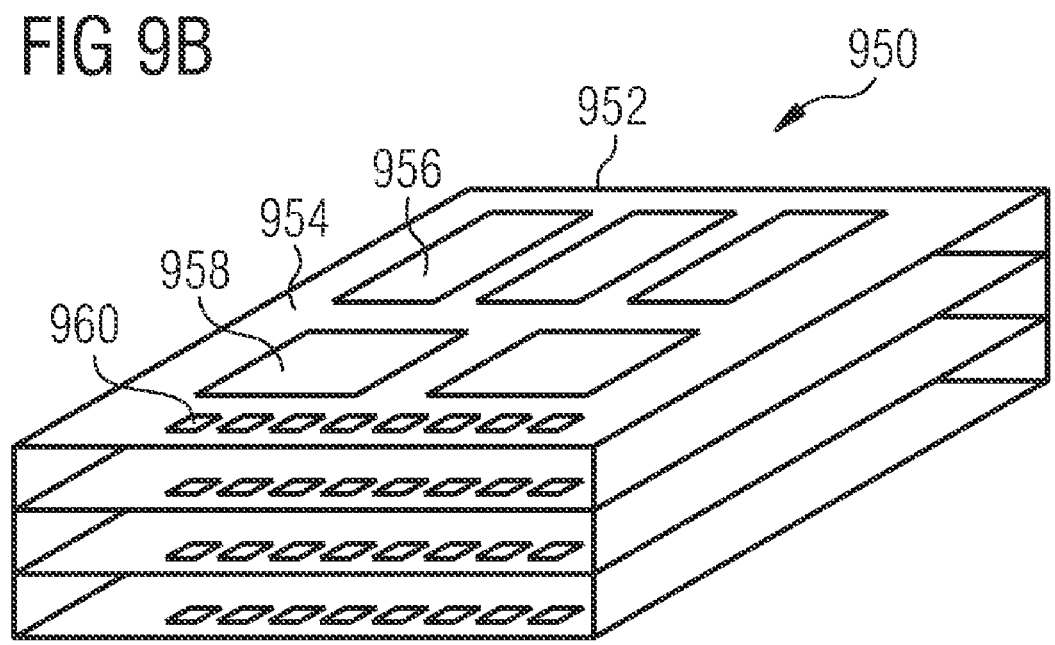
FIG. 9B shows a schematic perspective view of a memory module according to one embodiment.

As shown in FIGS. 9A and 9B, in some embodiments, integrated circuits/memory cells such as those described herein may be used in modules. In FIG. 9A, a memory module 900 is shown, on which one or more integrated circuits/memory cells 904 are arranged on a substrate 902. The memory module 900 may also include one or more electronic devices 906, which may include memory, processing circuitry, control circuitry, addressing circuitry, bus interconnection circuitry, or other circuitry or electronic devices that may be combined on a module with integrated circuits/memory cells, such as the integrated circuits/memory cells 904. Additionally, the memory module 900 includes multiple electrical connections 908, which may be used to connect the memory module 900 to other electronic components, including other modules.

As shown in FIG. 9B, in some embodiments, these modules may be stackable, to form a stack 950. For example, a stackable memory module 952 may contain one or more integrated circuits/memory cells 956, arranged on a stackable substrate 954. The stackable memory module 952 may also include one or more electronic devices 958, which may include memory, processing circuitry, control circuitry, addressing circuitry, bus interconnection circuitry, or other circuitry or electronic devices that may be combined on a module with integrated circuits/memory cells, such as the integrated circuits/memory cells 956. Electrical connections 960 are used to connect the stackable memory module 952 with other modules in the stack 950, or with other electronic devices. Other modules in the stack 950 may include additional stackable memory modules, similar to the stackable memory module 952 described above, or other types of stackable modules, such as stackable processing modules, control modules, communication modules, or other modules containing electronic components.

Within the scope of the present invention, the term: a first layer is disposed "above" a second layer means that the first layer is directly arranged on the second layer, or means that at least one further layer is arranged between the first layer and the second layer. The same applies in an analog manner for the term "below".

Figure 10:
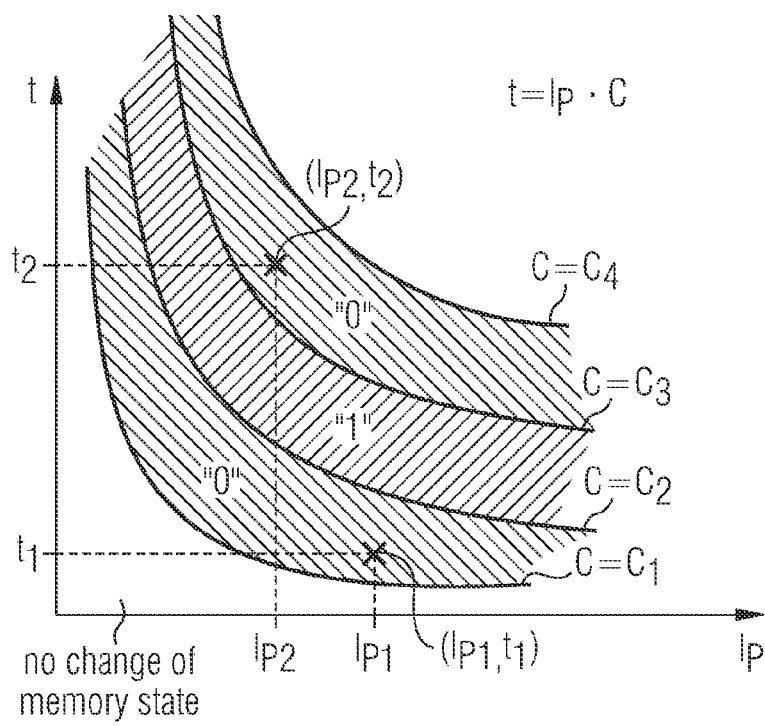
FIG. 10 shows a diagram representing different memory states of a memory cell according to one embodiment.

FIG. 10 shows a diagram representing different memory states of a magneto-resistive memory cell being part of an integrated circuit. The memory cell is designed such that each memory state of the memory cell is represented by an area located within an $I_P$-t plane, wherein $I_P$ is the programming current routed through the memory cell, and wherein t is the time period for which the programming current $I_P$ is routed through the memory cell. In order to set a memory cell to a memory state represented by a particular area, a programming current $I_P$ is routed through the memory cell for a period of time t, wherein the pair of values ($I_P$; t) corresponds to a point which lies within the particular area. Here, for example, a memory state "0" is represented by an area confined by two border lines, a first border line being defined by equation $t*I_P=c1$, and a second border line being defined by equation $t*I_P=c2$, c1 and c2 being different constants. A memory state "1" is represented by an area confined by two border lines, a second border line being defined by equation $t*I_P=c2$, and a third border line being defined by equation $t*I_P=c3$, c2 and c3 being different constants. In the same way, the memory state "0" is further represented by an area confined by two border lines, a third border line being defined by equation $t*I_P=c3$, and a fourth border line being defined by equation $t*I_P=c4$, c3 and c4 being different constants. In this way, the same memory state may be represented by a plurality of different areas. This means that different currents $I_P$ and different time durations t can be used in order to set the memory cell to the same memory state. For example, the memory state "0" may be set by a current $I_{P1}$ and a time duration $t_1$, but may also be set by a current $I_{P2}$ and a time duration $t_2$. The shape and location of the areas is dependent on the material parameters of layers forming the memory cells, the shape of the layers, the kind of external magnetic fields applied to the memory cell, and may also be dependent on other parameters. It should be mentioned that pairs of values ($I_P$; t) corresponding to points located "below" the first border line will not cause any change of the memory state (i.e., the magnetization states) of the memory cell.

Figure 11:
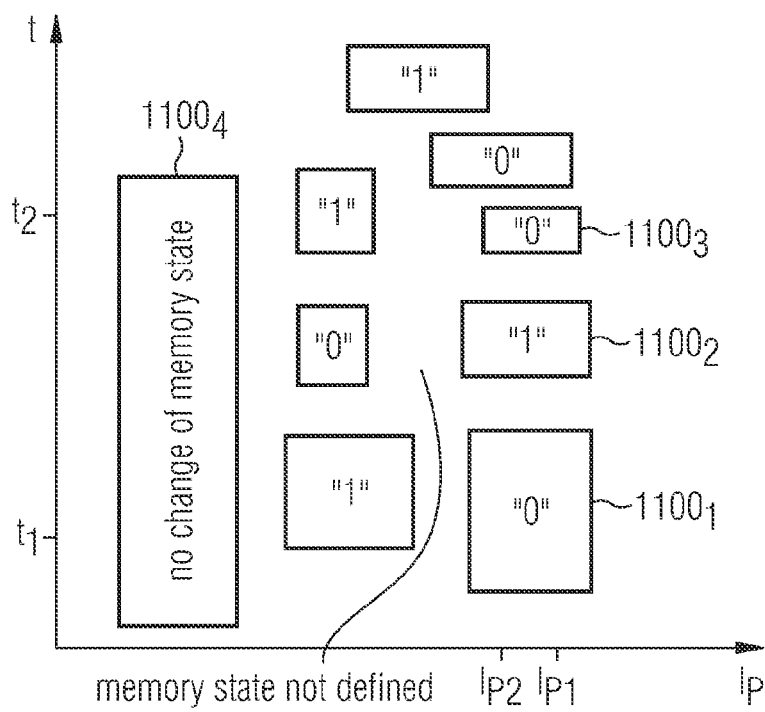
FIG. 11 shows a diagram representing different memory states of a memory cell according to one embodiment.

FIG. 11 shows a diagram representing different memory states of a memory cell being part of an integrated circuit. Also here, the same memory state is represented by different areas 1100 which means that different currents $I_P$ and different time durations t can be used in order to set the memory cell to the same memory state. For example, the memory state "0" may be set by a current $I_{P1}$ and a time duration $t_1$ (thereby being represented by area $1100_1$), but may also be set by a current $I_{P2}$ and a time duration $t_2$ (thereby being represented by area $1100_3$). Currents $I_P$ and time durations t represented by area $1100_4$ will not cause any change of the memory state. Regions between the areas 1100 represent currents $I_P$ and time durations t which do not lead to a predictable memory state. Here, the areas 1100 have a rectangular shapes. However, the present invention is not restricted thereto; arbitrary shapes are possible.

The diagrams shown in FIGS. 10 and 11 may vary depending from the initial memory state of the memory cell. That is, if the memory cell is in the memory state "0", the shape and/or location of the areas 1100/of the border lines $t^*I_P=c$ indicating the currents $I_P$ and time durations to set a memory state will be different compared to the case where the memory cell is in the memory state "1". Thus, according to an embodiment, two different current/time diagrams are used, depending on the initial state of the memory cell. In this case, a memory state read operation may be carried out before changing the memory state of a memory cell in order to be able to choose the right current/time diagram.

In the following description, further exemplary embodiments of the present invention will be explained.

According to an embodiment, a semiconductor memory device is provided. In particular, a non-volatile semiconductor device based on magnetic materials is provided. Today's standard memories are viewed to reach the limits of their scalability in the midterm future; therefore the semiconductor industry is looking for alternative memory concepts. One of the candidates to solve the current issues is the magnetic random access memory (MRAM) technology. The current state of the art technology, however, shows strong limitations in the ability to be scaled down to feature sizes and densities comparable to current main stream technologies such as DRAM or FLASH. One effect of embodiments of a MRAM-cell structure its mode of operation according to the present invention is that the use of the spin torque effect enables to scale down to very small feature sizes.

MRAM-technology may, for example, use Stoner-Wohlfarth type switching or toggle mode switching. In both cases, switching of a freelayer system relative to a reference system is done by an external field. Both techniques are limited to rather low density applications compared to DRAM or Flash. Another possibility is to switch the freelayer by passing a current through the junction (thermal select scheme). The thermal select scheme uses the fact that magnetic properties change with temperature, which allows to switch the freelayer more easily at elevated temperatures. Typically this is done by heating up the junction and subsequently cooling it down in an external field. This scheme poses strong challenges to the materials used, generally involves very complex stacks and thus results in huge problems concerning the patterning of the stack.

Spin torque technology on the other hand uses the fact that the magnetization of a ferromagnetic layer can be changed by injecting electrons of the opposite spin into the material. Conventional structures use a stack consisting of a reference system and a freelayer separated by a tunnelbarrier (MTJ (magnetic tunneling junction)-type) or a Cu-layer (GMR (giant magneto resistance). The switching into the parallel configuration is done by injecting the majority spin of the reference layer into the freelayer. The switching into the antiparallel configuration is done by depleting this spin direction. Normally, in order to do this, a bi-directional current is driven through the junction, requiring significant space in the periphery of the memory chip.

According to an embodiment, a simple (thus easy to pattern) stack is used, into which the information is written using a simple selection device for the spin torque switching scheme. According to an embodiment, the spin torque current used for switching is unidirectional.

According to an embodiment, the following relations are to be fulfilled:

The spin torque current needed to arrange the two ferromagnetic layers in a parallel configuration is $I_{PP}>I_{read}$, wherein $I_{read}$ is the current used for reading out the memory state.

The reading condition fulfilling ($I_{PP}$ or $I_{PA}$)>$I_{read}$ is a necessary condition for non-destructive cell information read out. According to an embodiment, $I_{read}$ is about 0.3 to 0.6*MAX ($I_{PP}$, $I_{PA}$). As an option, destructive read out is performed using advanced sensing schemes to correctly sense the initial information state before destruction.

The spin torque current needed to arrange the two ferromagnetic layers in an antiparallel configuration is $I_{PA}$.

For the case of identical pulse duration for $I_{PA}$ and $I_{PP}$, $I_{PA}$ needs to be different from $I_{PP}$, but larger than $I_{READ}$.

Let's assume that $I_{PA}>I_{PP}>I_{READ}$. It is also assumed that the current is passed from the bottom to the top of the memory cell, and that magnetization of the bottom layer is pointing to the right. A "1" is written by passing a current $I>I_{PA}$ through the memory cell, leading to a parallel configuration, with the top ferromagnetic layer also pointing to the right. To write a "0", a current $I_{PA}>1>I_{PP}$ is passed again from bottom to top of the memory cell, leading to an antiparallel configuration, now with the bottom ferromagnetic layer pointing to the left.

According to an embodiment, one or both of the top and bottom ferromagnetic layers can respectively include a plurality of ferromagnetic layers (multiple ferromagnetic layers). These ferromagnetic layers may be coupled (antiparallel coupled) with each other using, for example, Ru, Ir or Cu coupling layers.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a first ferromagnetic layer;
   a second ferromagnetic layer;
   a nonmagnetic layer being disposed between the first ferromagnetic layer and the second ferromagnetic layer, the first ferromagnetic layer, the second ferromagnetic layer and the nonmagnetic layer form a magneto-resistive memory cell; and a programming circuit configured to route a programming current through the magneto-resistive memory cell, wherein the programming current programs magnetizations of the first ferromagnetic layer and of the second ferromagnetic layer by spin induced switching effects, wherein the current used for programming the magneto-resistive memory cell is a unidirectional current, and wherein a current strength used to program the magnetization of the first ferromagnetic layer is different from a current strength used to program the magnetization of the second ferromagnetic layer.

2. The integrated circuit according to claim 1, wherein the current strengths used for programming the first ferromagnetic layer and the second ferromagnetic layer are larger than the current strength used for detecting a memory state of the magneto-resistive memory cell.

3. The integrated circuit according to claim 1, wherein the current strengths used for programming the magnetizations of the first ferromagnetic layer and the second ferromagnetic layer range from about 10 µA to about 1 mA.

4. The integrated circuit according to claim 1, wherein time durations used for programming the magnetizations of the first ferromagnetic layer and the second ferromagnetic layer range from about 50 ps to about 100 ns.

5. The integrated circuit according to claim 1, wherein the first ferromagnetic layer and the second ferromagnetic layer comprise CoFeB, CoFe, or NiFe, or a combination of these materials.

6. The integrated circuit according to claim 1, wherein the nonmagnetic layer comprises AlOx, MgO, or Cu, or a combination of these materials.

7. The integrated circuit according to claim 1, wherein the magneto-resistive memory cell comprises additional layers disposed between the nonmagnetic layer and the first ferromagnetic layer, between the nonmagnetic layer and the second ferromagnetic layer, above the second ferromagnetic layer, or below the first ferromagnetic layer.

8. The integrated circuit according to claim 7, wherein the additional layers comprise Ta, TaN, Ti, TiN, or NiFeCr, or a combination of these materials.

9. The integrated circuit according to claim 1, wherein the thicknesses of the first magnetic layer and the second magnetic layer each has a thickness in the range from about 1 nm to about 20 nm.

10. The integrated circuit according to claim 1, wherein the nonmagnetic layer has a thickness from about 0.3 nm to about 3 nm.

11. The integrated circuit according to claim 1, further comprising a select device assigned to the magneto-resistive memory cell, the select device comprising a field effect transistor or a diode.

12. The integrated circuit according to claim 1, wherein the magneto-resistive memory cells are designed such that each memory state of the magneto-resistive memory cell is represented by an area within an IP-t plane, wherein IP is a programming current routed through the magneto-resistive memory cell, and wherein t is a time period for which the programming current IP is routed through the magneto-resistive memory cell.

13. The integrated circuit according to claim 12, wherein, in order to set the memory cell to a memory state represented by a particular area, a programming current IP is routed through the memory cell for a period of time t, wherein the values IP and t corresponds to a point which lies within the particular area.

14. The integrated circuit according to claim 13, wherein each memory state is represented by an area confined by two border lines, the first border line being defined by equation t*IP=c1, and the second border line being defined by equation t*JP=c2, c1 and c2 being different constants.

15. A memory cell arrangement, comprising a plurality of magneto-resistive memory cells, each magneto-resistive memory cell comprising:
a first ferromagnetic layer;
a second ferromagnetic layer; and
a nonmagnetic layer being disposed between the first ferromagnetic layer and the second ferromagnetic layer;
the arrangement also comprising a programming circuit configured to route programming currents through the magneto-resistive memory cells, wherein the programming current routed through the magneto-resistive memory cell programs magnetizations of the first ferromagnetic layer and of the second ferromagnetic layer of the magneto-resistive memory cell by spin induced switching effects, wherein the current used for programming each magneto-resistive memory cell is a unidirectional current, and wherein a current strength used to program the magnetization of the first ferromagnetic layer is different from a current strength used to program the magnetization of the second ferromagnetic layer.

16. A memory cell, comprising:
a first ferromagnetic layer;
a second ferromagnetic layer; and
a nonmagnetic layer being disposed between the first ferromagnetic layer and the second ferromagnetic layer,
wherein the memory cell is connectable to a programming circuit configured to route a programming current through a magneto-resistive memory cell; and
wherein the first ferromagnetic layer, the second ferromagnetic layer and the nonmagnetic layer are arranged such that magnetizations of the first ferromagnetic layer and of the second ferromagnetic layer are programmable by spin induced switching effects caused by the programming current, wherein the current used for programming the memory cell is a unidirectional current, and wherein a current strength used to program the magnetization of the first ferromagnetic layer is different from a current strength used to program the magnetization of the second ferromagnetic layer.

17. A method of operating an integrated circuit comprising a magneto-resistive memory cell, the method comprising:
routing a programming current through a stack of layers comprising a first ferromagnetic layer, a second ferromagnetic layer, and a nonmagnetic layer that is disposed between the first ferromagnetic layer and the second ferromagnetic layer,
wherein magnetization of the first ferromagnetic layer or of the second ferromagnetic layer is adjusted by spin induced switching effects which are caused by the programming current; or wherein the magnetizations of the first ferromagnetic layer and of the second ferromagnetic layer are adjusted by spin induced switching effects which are caused by the programming current, wherein the current used for programming the magneto-resistive memory cell is a unidirectional current, and wherein a current strength used to program the magnetization of the first ferromagnetic layer is different from a current strength used to program the second ferromagnetic layer.

18. The method according to claim 17, wherein the current strengths used for programming the first ferromagnetic layer and the second ferromagnetic layer are larger than a current strength used for detecting the memory state of the magneto-resistive memory cell.

19. The method according to claim 17, wherein the current strengths used for programming the magnetization of the first ferromagnetic layer and of the second ferromagnetic layer range from about 10 µA to about 1 mA.

20. The method according to claim 17, wherein time durations used for programming the magnetization of the first ferromagnetic layer and of the second ferromagnetic layer range from about 50 ps to about 100 ns.

21. A method of manufacturing a magneto-resistive memory cell, the method comprising:
   forming a first ferromagnetic layer;
   forming a second ferromagnetic layer; and
   forming a nonmagnetic layer being disposed between the first ferromagnetic layer and the second ferromagnetic layer,
   wherein the formation of the first ferromagnetic layer, the second ferromagnetic layer, and the nonmagnetic layer is carried out such that magnetizations of the first ferromagnetic layer and of the second ferromagnetic layer are programmable by spin induced switching effects generated by a programming current which is routed through the magneto-resistive memory cell, wherein the current used for programming the magneto-resistive memory cell is a unidirectional current, and wherein a current strength used to program the magnetization of the first ferromagnetic layer is different from a current strength used to program the second ferromagnetic layer.

* * * * *